United States Patent
Tyler et al.

(10) Patent No.: US 7,636,226 B2
(45) Date of Patent: Dec. 22, 2009

(54) CURRENT PROTECTION CIRCUIT USING MULTIPLE SEQUENCED BIPOLAR TRANSISTORS

(75) Inventors: Matthew A. Tyler, Kaysville, WA (US); John J. Naughton, Idaho Falls, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 418 days.

(21) Appl. No.: 11/567,688

(22) Filed: Dec. 6, 2006

(65) Prior Publication Data

US 2008/0137252 A1    Jun. 12, 2008

(51) Int. Cl.
*H02H 3/20*    (2006.01)
*H02H 9/04*    (2006.01)
*H02H 9/00*    (2006.01)

(52) U.S. Cl. ........................... 361/91.5; 361/56
(58) Field of Classification Search .............. 361/56, 361/91.5
See application file for complete search history.

(56) References Cited

U.S. PATENT DOCUMENTS

| | | | |
|---|---|---|---|
| 5,530,612 A | 6/1996 | Maloney | 361/56 |
| 5,708,549 A * | 1/1998 | Croft | 361/56 |
| 5,835,328 A | 11/1998 | Maloney et al. | 361/111 |
| 6,442,008 B1 | 8/2002 | Anderson | 361/56 |
| 6,535,368 B2 | 3/2003 | Andresen et al. | 361/56 |
| 6,537,868 B1 | 3/2003 | Yu | 438/237 |
| 6,549,061 B2 | 4/2003 | Voldman et al. | 327/483 |
| 6,724,603 B2 | 4/2004 | Miller et al. | 361/111 |
| 6,760,209 B1 | 7/2004 | Sharpe-Geisler | 361/111 |
| 6,891,230 B2 * | 5/2005 | Yu | 257/361 |
| 7,061,735 B2 * | 6/2006 | Umemoto | 361/56 |

* cited by examiner

*Primary Examiner*—Fritz M. Fleming
*Assistant Examiner*—Lucy Thomas
(74) *Attorney, Agent, or Firm*—Rennie W. Dover

(57) ABSTRACT

A current protection circuit that uses a sequence of bipolar transistors to provide or draw current from a protected circuit node. An initial bipolar transistor has its emitter terminal coupled to the protected circuit node, with its collector terminal coupled to a current source or sink. One or more additional intermediary bipolar transistors are also provided in the sequence. Each additional intermediary bipolar transistor has its emitter terminal coupled to the base terminal of the previous bipolar transistor in the sequence, and has its collector terminal coupled to the current source or sink. To complete the sequence, a reverse-biased diode is coupled between the base terminal of the final intermediary bipolar transistor and the current source or sink. This allows for effective triggering of current protection for a protected circuit node without requiring a zener diode.

20 Claims, 3 Drawing Sheets

CURRENT PROTECTION CIRCUIT USING MULTIPLE SEQUENCED BIPOLAR TRANSISTORS

BACKGROUND

Electronic circuitry provides complex functionality that is proving ever more useful. In one common form, circuitry is formed on a semiconductor or other substrate using microfabrication processing technology. Typically, circuits with small feature dimension sizes are not designed to carry large amounts of current. So long as the voltage range at any given node does not extend outside of its designed range, these currents remain relatively low and the circuitry will typically operate as designed. However, if the voltage range at any given node extends out of its designed range, a condition of Electrical OverStress (EOS) may occur.

For example, most common semiconductor fabrication processes use substrate or bulk semiconductor with different dopants implanted into certain regions of the substrate. These implant regions define unique electrical characteristics that are important or essential for circuit functionality. Thus, EOS experienced at any of the implant regions may adversely impact circuit performance. Another area where EOS may adversely affect performance is in the interlayer dielectrics, which have voltage limitations as well. Driving a circuit outside of its normal operating range can often temporarily disable performance of the circuit, reduce the operational lifetime of the circuit, or even immediately destroy the circuit. EOS can take many forms, but commonly takes the form of Electro Static Discharge (ESD) events.

Many current protection structures have been designed that are suitable for dissipating current to or from corresponding critical circuit nodes in order to provide protection to corresponding circuitry. Conventionally, a more likely source of excess current is on the pads of integrated circuits, where externally generated voltages and currents are applied to the integrated circuit. However, excess current may be experienced at other circuit nodes as well. To deal with the potential of EOS events occurring at a given node, conventional circuits often include current protection structures at or near the circuit node to be protected.

One conventional technique for providing current protection is to use a zener diode in reversed-biased mode between the circuit node to be protected and a current source or sink. When the reverse breakdown voltage of the zener diode is exceeded due to an EOS event, current flows to or from the circuit node through the reverse-biased zener diode in order to mitigate or eliminate harm to the core circuitry.

However, the processes associated with fabrication of a zener diode are not always standard for given process sets. The introduction of non-standard process steps into a process set can be costly.

BRIEF SUMMARY OF THE INVENTION

Embodiments of the present invention relate to a current protection circuit that uses a sequence of bipolar transistors, rather than a zener diode, to provide or draw current from a protected circuit node. An initial bipolar transistor has its emitter terminal coupled to the protected circuit node, with its collector terminal coupled to a current source or sink. One or more additional intermediary bipolar transistors are also provided in the sequence. Each additional intermediary bipolar transistor has its emitter terminal coupled to the base terminal of the previous bipolar transistor in the sequence, and has its collector terminal coupled to the current source or sink. To complete the sequence, a diode in reverse-bias configuration is coupled between the base terminal of the final intermediary bipolar transistor and the current source or sink.

As compared to using a single bipolar transistor, the use of such sequenced bipolar transistors reduces the current triggering voltage differential between the protected circuit node and the current source or sink. This allows for effective triggering of current protection for a protected circuit node without requiring a zener diode. This may also permit the area of the current protection circuit to be smaller since even a sequence of bipolar transistors may be smaller than a zener diode with similar current-voltage characteristics. Furthermore, the current protection circuit may be made to be unidirectional, whereas a zener diode on its own is bidirectional.

These and other features of the embodiments of the present invention will become more fully apparent from the following description and appended claims, or may be learned by the practice of the invention as set forth hereinafter.

BRIEF DESCRIPTION OF THE DRAWINGS

To further clarify the above and other advantages and features of embodiments of the present invention, a more particular description of the embodiments of the invention will be rendered by reference to the appended drawings. It is appreciated that these drawings depict only typical embodiments of the invention and are therefore not to be considered limiting of its scope. The embodiments will be described and explained with additional specificity using the accompanying drawings in which.

DETAILED DESCRIPTION OF THE PREFERRED EMBODIMENTS

Figure 1:
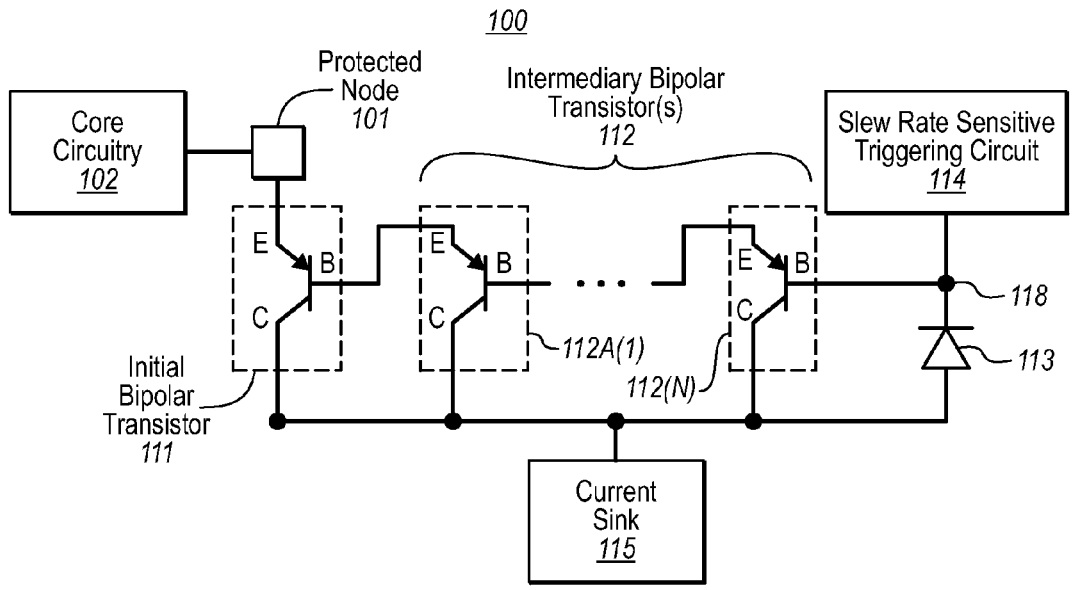
FIG. 1 illustrates a current protection circuit including a sequence of PNP bipolar transistors in accordance with the principles of the present invention.
Figure 2:
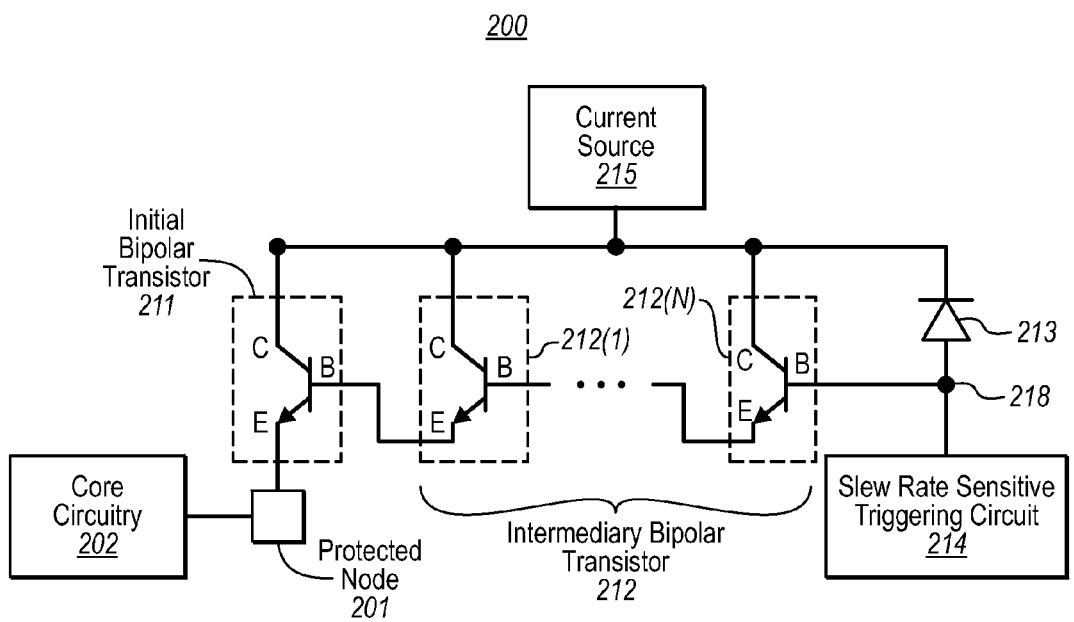
FIG. 2 illustrates a current protection circuit including a sequence of NPN bipolar transistors in accordance with the principles of the present invention.

Embodiments of the present invention relate to the use of a current protection circuit configured to provide current protection to a circuit node through a sequence of two or more bipolar transistors and a final reverse-biased diode. FIG. 1 illustrates an example embodiment in which the sequence of bipolar transistors includes PNP bipolar transistors, whereas FIG. 2 illustrates an example embodiment in which the sequence of bipolar transistors includes NPN bipolar transistors.

A current protection circuit protects a circuit node from experiencing excessive voltages thereby protecting core circuitry that is coupled to the protected circuit node. For instance, the current protection circuitry 100 of FIG. 1 shows a protected node 101 that is coupled to core circuitry 102. The remainder of the current protection circuitry 100 is configured to draw an appropriate amount of current from the protected node 101 so as to keep the protected node 101 from experiencing excessively high voltage levels. This prevents the core circuitry 102 from experiencing harmful levels of current.

The current protection circuit 100 includes, amongst other items, a sequence of PNP bipolar transistors including an initial PNP bipolar transistor 111, one or more intermediary PNP bipolar transistors 112 and a final reverse-biased diode 113. As is well known, a bipolar transistor includes a structure of three layers including two layers of a common polarity type (e.g., one of p-type or n-type) surrounding a middle layer of the opposite polarity type (e.g. the other of n-type or p-type). For example, a PNP bipolar transistor includes a p-type emitter terminal (labeled as "B" for each bipolar transistor of FIG. 1), an n-type base terminal (labeled as "B" for each bipolar transistor of FIG. 1), and a p-type collector terminal (labeled as "C" for each bipolar transistor of FIG. 1). The same terminal labeling ("E", "B" and "C") applies for the bipolar transistors of FIGS. 2 and 3 as well. In this description and in the claims, PNP bipolar transistors are the same polarity as other PNP bipolar transistors and the opposite polarity of NPN bipolar transistors. Conversely, NPN bipolar transistors are the same polarity as other NPN bipolar transistors and the opposite polarity of PNP bipolar transistors.

The initial PNP bipolar transistor 111 has its emitter terminal coupled to the protected node 101, and its collector terminal coupled to a current sink 115. In this description and in the claims, two circuit nodes are "connected to" each other if direct current may flow between the circuit nodes in both directions without passing through any designed intermediary elements. Of course, there will always be some resistance between circuit nodes since there are no conductors with infinitely small resistance. In contrast, two circuit elements are "coupled to" each other if direct current may flow between the circuit nodes (at least in one direction—but possibly both directions) either by being directly connected without passing through intermediary circuit elements, or indirectly through one or more other circuit elements (such as, for example, a resistor, inductor, or diode).

The current protection circuit 100 also includes one or more intermediary PNP bipolar transistor(s) 112. In the illustrated case of FIG. 1, only intermediary bipolar transistors 112(1) and 112(N) are illustrated. However, the horizontal ellipses between the two illustrated intermediary bipolar transistors represents that there may be additional intermediary PNP bipolar transistors between PNP bipolar transistors 112(1) and 112(N). However, unlike the usual meaning of ellipses, the horizontal ellipses as used herein also represents that there may be just one intermediary PNP bipolar transistor. In that case, the intermediary PNP bipolar transistor 112(N) is the same as the intermediary PNP bipolar transistor 112(1).

In any case, the emitter terminal of each of the one or more intermediary PNP bipolar transistors 112 is coupled to the base terminal of the previous bipolar transistor. For instance, the emitter terminal of the intermediary PNP bipolar transistor 112(1) is coupled to the base terminal of the initial PNP bipolar transistor 111. If there were a second intermediary PNP bipolar transistor 112(2), that bipolar transistor's 112(2) emitter terminal would be coupled to the first intermediary PNP bipolar transistor's 112(1) base terminal. The coupling of the subsequent emitter terminal to the prior base terminal continues throughout the sequence, regardless of the number of bipolar transistors in the sequence. Each of the initial PNP bipolar transistor's 111 collector terminal and the one or more intermediary PNP bipolar transistor's 112 collector terminal are coupled to the current sink 115.

Figure 3:
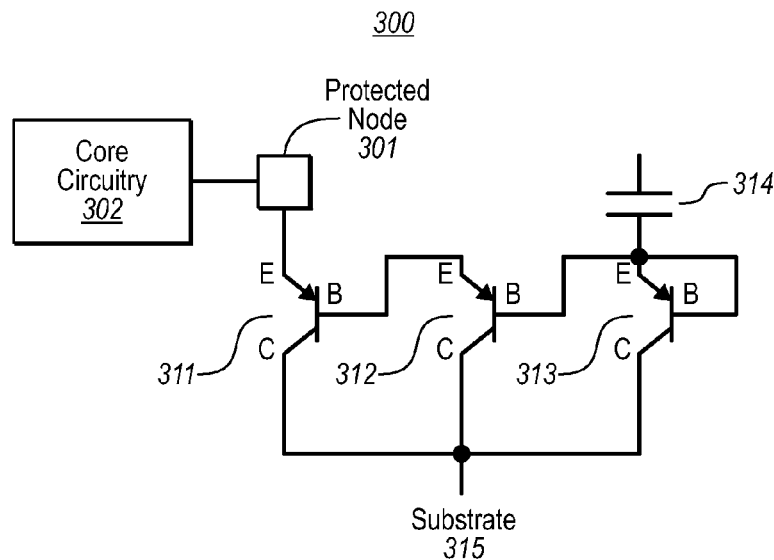
FIG. 3 illustrates a more specific embodiment of the current protection circuit of FIG. 1.

A diode is coupled in reversed-biased configuration between the base terminal of the final intermediary PNP bipolar transistor 112(N) and the current sink 115 As will be shown with respect to FIG. 3, one example of a reverse-biased diode is an additional bipolar transistor coupled in a diode-configuration with its emitter and base terminals coupled together, and with its collector terminal coupled to the current sink 115. The base and emitter terminals of the diode-connected bipolar transistor would be coupled to the base terminal of the final intermediary PNP bipolar transistor 112(N).

In one embodiment of the invention, the active region in each of the subsequent bipolar transistors in the sequence becomes progressively smaller. For instance, if there were two bipolar transistors, an initial bipolar transistor and a single intermediary bipolar transistor, the initial bipolar transistor would have an active region that is larger than the active region of the intermediary bipolar transistor. Furthermore, the intermediary bipolar transistor may have an active region that is larger than the active region of the reverse-biased diode 113.

An optional slew rate sensitive triggering circuit 114 is configured to detect whether or not a rate of change of voltage at the intermediary node 118 satisfies a trigger rate. The intermediary node 118 is between the base terminal of the last intermediary bipolar transistor 112(N) and the reverse-biased diode 113. Although not required, the trigger rate may differ depending on the voltage already present at the intermediary node 118.

Regardless, if the trigger rate is satisfied, the slew rate sensitive triggering circuit 114 draws current from the base terminal of the final intermediary bipolar transistor 112(N) even if a reverse breakdown voltage of the diode 113 is not encountered. In one embodiment, the slew rate sensitive triggering circuit 114 draws no or relatively lower amounts of current from the base terminal of the final intermediary bipolar transistor 112(N) if the trigger rate is not satisfied.

The slew rate sensitive triggering circuit 114 may be any circuit that is configured to perform as just described. For instance, the slew rate sensitive trigger circuit 114 may be a simple capacitor, multiple networked capacitors, an RC network and/or a network of one or more transistors.

The operation of the current protection circuit 100 will now be described in further detail. In one embodiment, the reverse breakdown voltage of the diode 113 may be designed to be lower than the reverse breakdown voltage of the base-collector junctions of the initial bipolar transistor 111 and the intermediary bipolar transistor(s) 112.

Accordingly, as the voltage rises on the protected node 101, the voltage across the reverse-biased diode 113 will likewise increase albeit perhaps not to the same extent. At some point, the reverse-bias voltage across the diode 113 will be sufficient such that significant current will be drawn from the base terminal of the final intermediary bipolar transistor 112(N). This will result in even more current being drawn from the base terminal of the prior bipolar transistor through the emitter terminal of the final intermediary bipolar transistor 112 (N).

Thus, as one tracks current flow from the final diode 113 (which initially triggers current flow) backwards in the sequence to the initial bipolar transistor 111, the current drawn becomes amplified with each step. For instance, suppose that there are two bipolar transistors prior to the final diode, and that the base current in each of the transistors is approximately one twentieth of the emitter current for that bipolar transistor. The current drawn by the emitter terminal of the intermediary bipolar transistor would be 20 times the current drawn through the final diode, whereas the current drawn by the emitter terminal of the initial bipolar transistor from the protected node would be 400 times the current drawn through the final diode.

The current protection circuit 100 is capable of reducing the trigger voltage of the protected node 101. This can prevent a possible race condition in which there is unacceptable uncertainty in terms of whether the current protection circuit 100 will activate prior to harm being caused to the core circuitry 102 being protected. Typically, zener diodes might be chosen for a current protection circuit due to their lower breakdown voltages. However, the current protection circuit 100 may provide lower breakdown voltages due to the sequencing of bipolar transistors, and without requiring customized processing steps sometimes associated with zener diode manufacture. Furthermore, since the layout area for zener diode manufacture is sometimes quite large, the size of the current protection structure may perhaps be reduced even though there are perhaps more circuit elements used to perform the current protection in the absence of a zener diode. Although the principles of the present invention permit current protection without the use of a zener diode in some embodiments, the principles of the present invention do not prohibit the use of a zener diode if desired. For instance, the diode 113 may be a Zener diode if desired.

Furthermore, the current protection structure 100 is unidirectional. If, for example, the voltage at the protected node 101 were to drop below the voltage at the collector terminals of the bipolar transistors 111 and 112 in the sequence, the base-collector junctions of the bipolar transistors would become reverse-biased. Accordingly, this would prevent reverse current flow to the protected node 101 from the current sink 115 (which would in that case actually behave as a current source). This is desirable since the core circuitry 102 may already have capability of handling such a reverse voltage condition, and in some cases, may rely on such reverse voltages for proper operation.

FIG. 1 has been described with respect to a sequence of PNP bipolar transistors used to prevent against excessively positive voltages on a protected circuit node. However, the principles of the present invention may also apply to a sequence of NPN bipolar transistors used to prevent against excessively negative voltages on a protected circuit node.

In particular, FIG. 2 illustrates a current protection circuit 200 that provides current protection to a protected circuit node 201 from experiencing excessively negative voltages with respect to the current source 215. If the current protection circuit 200 is triggered due to an excessive negative voltage at the protected node 201, current is provided by the current source 215 through the reverse-biased diode 213, through the intermediary NPN bipolar transistors 212, through the initial NPN bipolar transistor 211 and to the protected node 201. This accordingly prevents the protected node 201 from becoming more negative, and thus protects core circuitry 202.

The current protection circuit 200 is similar to the current protection circuit 100 of FIG. 1 with a few exceptions. First, instead of PNP bipolar transistors 111 and 112, NPN bipolar transistors 211 and 212 are provided. Furthermore, the collector terminals of the NPN bipolar transistors are coupled to a current source 215, rather than a current sink 115. Like FIG. 1, however, the emitter terminal of the initial NPN bipolar transistor 211 is coupled to the protected circuit node 201, whereas the emitter terminal of each intermediary NPN bipolar transistor 212 is coupled to the base terminal of the previous NPN bipolar transistor in the sequence. The reverse-biased diode 213 is reverse-biased from the direction of the current source 215 to the base terminal of the final NPN intermediary bipolar transistor 212(N) in the sequence. Once again, the reverse-biased diode 213 may be a final NPN bipolar transistor coupled in a diode configuration with its base and emitter terminals coupled together.

A slew rate sensitive trigger circuit 214 is coupled to the base terminal of the final intermediary NPN bipolar transistor 212N. The slew rate sensitive trigger circuit 214 is configured to detect whether or not a rate of change of voltage at the intermediary node 218 satisfies a trigger rate (the rate potentially also depending on the current voltage at the intermediary node 218). If the trigger rate is satisfied, current is provided to the base terminal of the final intermediary NPN bipolar transistor 212(N) even if a reverse breakdown voltage of the diode is not encountered. In one embodiment, if the trigger rate is not satisfied, the slew rate sensitive trigger circuit 214 is configured to provide no or relatively lower amounts of current to the base terminal of the final intermediary NPN bipolar transistor 212(N). This has the effect of providing current protection even perhaps in advance of the reverse breakdown voltage of the diode 213 being encountered. Thus, triggering of the current protection circuit is accelerated.

FIG. 3 illustrates a specific example current protection circuit 300 that represents a very specific embodiment of the current protection circuit 100 of FIG. 1. The protected node 301 and core circuitry 302 of FIG. 3 correspond to the protected node 101 and core circuitry 102 of FIG. 1. The PNP bipolar transistor 311 of FIG. 3 corresponds to the initial PNP bipolar transistor 111 of FIG. 1. In this example, there is only one intermediary PNP bipolar transistor 312, which corresponds to intermediary PNP bipolar transistor(s) 112 of FIG. 1. Furthermore, the diode-connected PNP bipolar transistor 313 represents a specific example embodiment of the reverse-biased diode 113 of FIG. 1. As previously mentioned, however, the reverse-biased diode 113 may be any reverse-biased diode. The capacitor 314 represents an example of the slew rate sensitive triggering circuit 114 of FIG. 1. As previously mentioned, however, the slew rate sensitive triggering circuit 114 of FIG. 1 may be any circuit that enables current to be drawn from the base terminal of the final intermediary bipolar transistor prior to the reverse-biased diode. The substrate 315 of FIG. 3 corresponds to the current sink 115 of FIG. 1.

Figure 4:
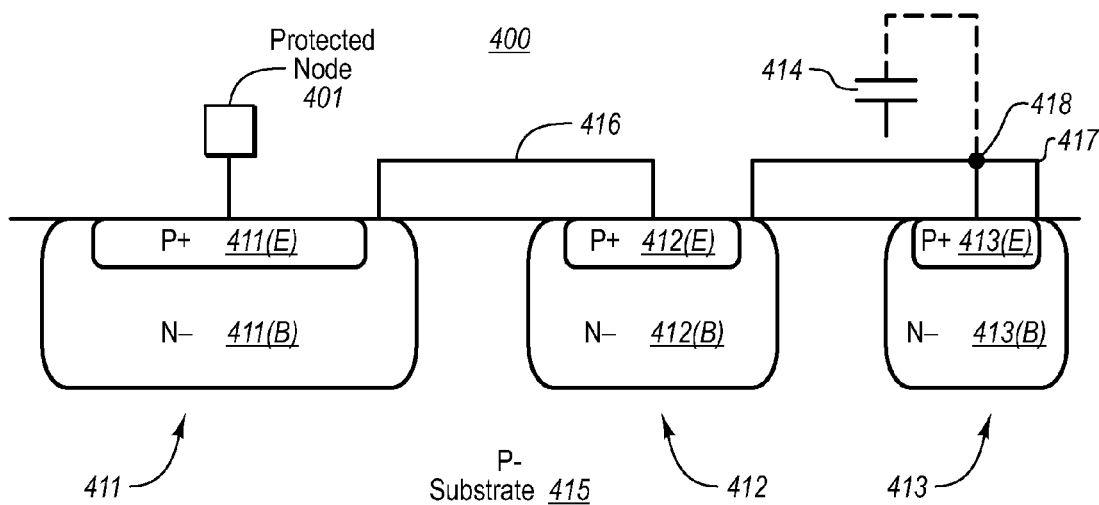
FIG. 4 illustrates an example of the current protection circuit of FIG. 3 in which a cross section of the sequence of PNP bipolar transistors are shown as vertical PNP bipolar transistors, and in which the active regions are progressively smaller as one proceeds through the sequence.

FIG. 4 illustrates an example diagram showing an example structure 400 of the current protection structure 300 of FIG. 3. The protected node 401 and the capacitor 414 (corresponding to the protected node 301 and the capacitor 314) are illustrated as abstract circuit elements symbols. The PNP bipolar transistors 311 through 313 of FIG. 3 are illustrated as vertical PNP bipolar transistors 411 through 413 in FIG. 4. The p− substrate 415 is the common collector terminal for each transistor 411 through 413, and corresponds to the substrate 315 of FIG. 3. The emitter terminals of each of the transistors 411 through 413 are represented by corresponding p+ diffusion regions 411(E), 412(E) and 413(E). The base terminals of each of the transistors 411 through 413 are represented by corresponding n− wells 411(B), 412(B) and 413(B).

The p+ diffusion region 411(E) representing the emitter terminal of the PNP bipolar transistor 411 is connected to the protected node 401. The n− well region 411(B) representing the base terminal of PNP bipolar transistor 411 is connected to the p+ region 412(E) representing the emitter terminal of the PNP bipolar transistor 412 as represented symbolically by connection line 416. The n− well region 412(B) representing the base terminal of PNP bipolar transistor 412 is connected to the p+ diffusion region 413(E) representing the emitter terminal of the PNP bipolar transistor 413 as represented symbolically by connection line 417. To couple the PNP bipolar transistor is a reverse-diode configuration, the n– well region 412(B) is also connected to the n– well region 413(B) representing the base terminal of the PNP bipolar transistor 413 as also represented by the connection line 417.

During operation, as the voltage at the protected node 401 rises, the voltage present at the intermediary node 418 will also rise. Once the intermediary node 418 rises to a voltage that overcomes the reverse breakdown voltage of the reverse-biased diode represented by PNP bipolar transistor 413, current will flow from the n-well region 412(B), through the connection 417, through the n-well region 413(B). This will initiate base current in the PNP bipolar transistor 412. This effect will be current amplified and propagated backwards through the sequence of bipolar transistors.

In particular, with base current being drawn from PNP bipolar transistor 412, the bipolar transistor 412 will draw larger currents from the base terminal of bipolar transistor 411 through the emitter terminal of bipolar transistor 412. With base current being drawn from PNP bipolar transistor 411, even more current will be drawn into the emitter terminal of the PNP bipolar transistor 411 from the protected circuit node 401. Accordingly, much more current is drawn through the bipolar transistor 411 than through the bipolar transistor 413. For instance, if the ratio of emitter to base current for all of the bipolar transistors is 20 to 1, the bipolar transistors 411 would draw perhaps 400 times the current that is initially provided by the bipolar transistor 413. Of course, there are some boundary conditions that might make this difficult for smaller bipolar transistors, but the bipolar transistor 413 could be made the same size as the bipolar transistor 412, or perhaps half as large as the bipolar transistor 412.

To accommodate this current amplification, and to prevent excess current density in the active regions of the bipolar transistors, the active region of the bipolar transistor 411 may be larger than the active region of the bipolar transistor 412. For the same reason, the active region of the bipolar transistor 412 may be larger than the active region of the bipolar transistor 413. As an example, the ratio in size of the active region may approximate the ratio of emitter to base current for a particular bipolar transistor. In the example in which the emitter current for a given bipolar transistor is 20 times the base current, the active region of bipolar transistor 411 might be 20 times the size of the active region of the bipolar transistor 412 and perhaps 400 times the size of the active region of the bipolar transistor 413.

Figure 5:
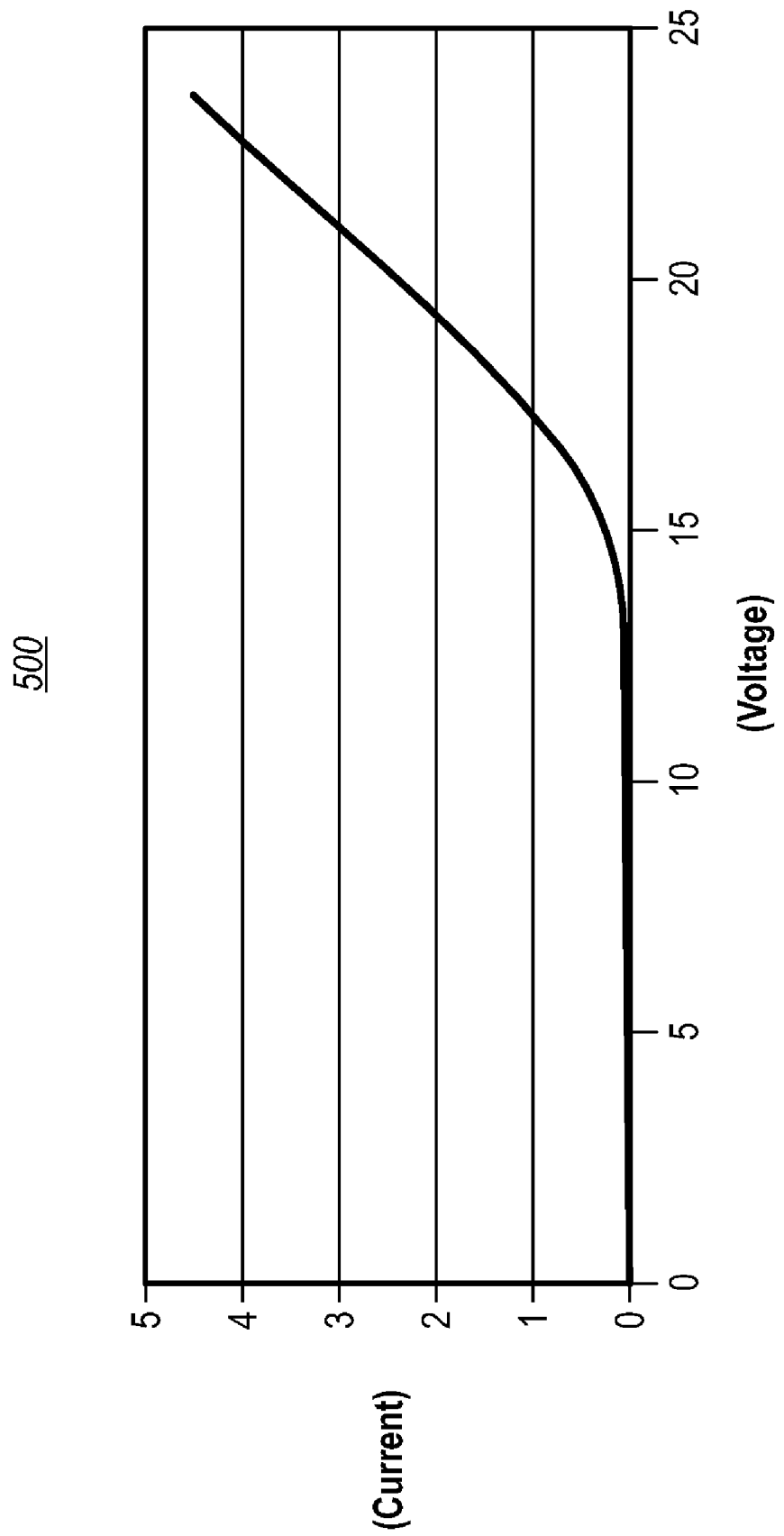
FIG. 5 illustrates a graph showing the current voltage characteristics of an example of the current protection circuit of FIG. 4.

FIG. 5 illustrates a diagram 500 of how an example of the structure 400 of FIG. 4 may operate. In one example, the static (or DC) breakdown of the base-collector of a single bipolar junction is approximately 19 volts. When placed in the triple Darlington configuration of FIG. 4, the DC breakdown of such a sequence of bipolar transistors was reduced to about 16.8 volts. As can be seen from FIG. 5, the dynamic breakdown in simulated results was even lower at approximately 14 volts.

Accordingly, a current protection circuit has been described that is compared of a sequence of bipolar transistors, rather than requiring a zener diode. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A current protection circuit configured to provide current protection to a circuit node, comprising:
    a first bipolar transistor having emitter, collector, and base terminals, the emitter terminal of the first bipolar transistor coupled to the circuit node, the collector terminal of the first bipolar transistor coupled to a current source or sink;
    a second bipolar transistor having emitter, collector, and base terminals, the emitter terminal of the second bipolar transistor coupled to the base terminal of the first bipolar transistor, the collector terminal of the second bipolar transistor coupled to the current source or sink; and
    a diode coupled between the base terminal of the second bipolar transistor and the current source or sink, wherein the diode is a voltage dependent triggering element that is independent of the time rate of change of a voltage at a node formed by the base of the second transistor and a terminal of the diode.

2. The current protection circuit in accordance with claim 1, wherein the first and second bipolar transistors are both of the same polarity.

3. The current protection circuit in accordance with claim 1, wherein the first bipolar transistor is a first PNP bipolar transistor, and the second bipolar transistor is a second PNP bipolar transistor.

4. The current protection circuit in accordance with claim 1, wherein the first bipolar transistor is a first NPN bipolar transistor, and the second bipolar transistor is a second NPN bipolar transistor.

5. The current protection circuit in accordance with claim 1, wherein the diode is a third bipolar transistor having emitter, collector, and base terminals, wherein the emitter and base terminals of the third bipolar transistor are coupled together.

6. The current protection circuit in accordance with claim 5, wherein the second bipolar transistor has an active region that is larger than the active region of the third bipolar transistor.

7. The current protection circuit in accordance with claim 6, wherein the first bipolar transistor has an active region that is larger than the active region of the second bipolar transistor.

8. The current protection circuit in accordance with claim 5, wherein the first, second, and third bipolar transistors are each of the same polarity.

9. The current protection circuit in accordance with claim 1, wherein the diode is coupled to the base terminal of the second bipolar transistor at least through a series of one or more intermediary diodes.

10. The current protection circuit in accordance with claim 9, wherein at least one of the one or more intermediary diodes is a portion of an intermediary bipolar transistor.

11. The current protection circuit in accordance with claim 1, further including at least one intermediary bipolar transistor, the at least one intermediary bipolar transistor of the same polarity as the first and second bipolar transistors, each of the at least one intermediary bipolar transistor having a collector terminal coupled to the current source or sink.

12. The current protection circuit in accordance with claim 1, wherein the first bipolar transistor has an active region that is larger than the active region of the second bipolar transistor.

13. The current protection circuit in accordance with claim 1, further comprising:
    a slew rate sensitive trigger circuit coupled to an intermediary node between the diode and the base terminal of the second bipolar transistor.

14. The current protection circuit in accordance with claim 13, wherein the second bipolar transistor is a PNP bipolar transistor, wherein the slew rate sensitive trigger circuit is configured to detect whether or not a rate of change of voltage at the intermediary node is greater than a trigger rate, and if greater than the trigger rate drawing current from the base terminal of the second bipolar transistor even if a reverse breakdown voltage of the diode is not encountered, and if less than the trigger rate drawing no and relatively lower amounts of current from the base terminal of the second bipolar transistor.

15. The current protection circuit in accordance with claim 13, wherein the second bipolar transistor is an NPN bipolar transistor wherein the slew rate sensitive trigger circuit is configured to detect whether or not a rate of change of voltage at the intermediary node satisfies a trigger rate, and if the trigger rate is satisfied providing current to the base terminal of the second bipolar transistor even if a reverse breakdown voltage of the diode is not encountered, and the trigger rate is not satisfied providing no and relatively lower amounts of current to the base terminal of the second bipolar transistor.

16. The current protection circuit in accordance with claim 13, wherein the slew rate sensitive circuit comprises a capacitor.

17. The current protection circuit in accordance with claim 13, wherein the slew rate sensitive circuit comprises an RC circuit.

18. The current protection circuit in accordance with claim 1, wherein the first and second bipolar transistors are each PNP bipolar transistors, and the current source or sink is a substrate.

19. A current protection circuit configured to provide current protection to a circuit node, comprising:

a first bipolar transistor having emitter, collector, and base terminals, the emitter terminal of the first bipolar transistor connected to the circuit node, the collector terminal of the first bipolar transistor connected to a current source or sink;

a second bipolar transistor having emitter, collector, and base terminals, the emitter terminal of the second bipolar transistor connected to the base terminal of the first bipolar transistor, the collector terminal of the second bipolar transistor connected to the current source or sink; and a diode coupled between the base terminal of the second bipolar transistor and the current source or sink, wherein the diode provides a dc current path for current flowing from the base of the second bipolar transistor.

20. A current protection circuit configured to provide current protection to a circuit node, comprising:

an initial bipolar transistor having emitter, collector, and base terminals, the emitter terminal of the initial bipolar transistor coupled to the circuit node, the collector terminal of the initial bipolar transistor coupled to a current source or sink;

one or more intermediary bipolar transistors, each having emitter, collector, and base terminals, the emitter terminal of each of the intermediary bipolar transistors coupled to the base terminal of the previous bipolar transistor, the collector terminal of each of the intermediary bipolar transistors coupled to the current source or sink; and a diode coupled between the base terminal of the final intermediary bipolar transistor and the current source or sink, wherein the diode is a voltage dependent triggering element that is independent of the time rate of change of a voltage at a node formed by the base of the second transistor and a terminal of the diode.

\* \* \* \* \*